US008212306B2

(12) United States Patent
Izumida et al.

(10) Patent No.: US 8,212,306 B2
(45) Date of Patent: Jul. 3, 2012

(54) SEMICONDUCTOR STORAGE DEVICE (75) Inventors: Takashi Izumida, Yokohama (JP);
Nobutoshi Aoki, Yokohama (JP);
Masaki Kondo, Kawasaki (JP);
Takahisa Kanemura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 12/721,757

(22) Filed: Mar. 11, 2010

(65) Prior Publication Data

US 2010/0295112 A1 Nov. 25, 2010

(30) Foreign Application Priority Data

May 21, 2009 (JP) ................................. 2009-122926

(51) Int. Cl.
*H01L 29/788* (2006.01)
(52) U.S. Cl. ...................... 257/317; 257/321; 257/E29.3
(58) Field of Classification Search .................... 257/317
See application file for complete search history.

(56) References Cited

U.S. PATENT DOCUMENTS

| 5,321,699 | A | 6/1994 | Endoh et al. | |
| 6,943,403 | B2 * | 9/2005 | Park | 257/317 |
| 7,508,026 | B2 * | 3/2009 | Iino et al. | 257/317 |
| 2005/0139898 | A1 * | 6/2005 | Choi | 257/315 |
| 2006/0060913 | A1 * | 3/2006 | Ozawa | 257/317 |

FOREIGN PATENT DOCUMENTS

| JP | 02-072672 | | 3/1990 |
| JP | 03034577 | A * | 2/1991 |
| JP | 2004-207695 | | 7/2004 |

* cited by examiner

*Primary Examiner* — Stephen W Smoot
(74) *Attorney, Agent, or Firm* — Turocy & Watson, LLP (57) ABSTRACT

A semiconductor storage device has a semiconductor substrate, a plurality of first insulating films formed on the semiconductor substrate with predetermined spacing therebetween, an element isolation region formed between the first insulating films in a first direction, a floating gate electrode comprising a first charge accumulation film formed on the first insulating film, a second charge accumulation film formed on the first charge accumulation film and having a width in a second direction orthogonal to the first direction smaller than the width of the first charge accumulation film, and a third charge accumulation film formed on the second charge accumulation film and having the width in the second direction larger than the width of the second charge accumulation film, a second insulating film formed on the second charge accumulation film and between the second charge accumulation film and the element isolation region, a third insulating film formed on the charge accumulation film and the element isolation region along the second direction, and a control gate electrode formed on the third insulating film.

18 Claims, 11 Drawing Sheets

SEMICONDUCTOR STORAGE DEVICE

CROSS REFERENCE TO RELATED APPLICATION

This application is based upon and claims benefit of priority from the Japanese Patent Application No. 2009-122926, filed on May 21, 2009, the entire contents of which are incorporated herein by reference.

BACKGROUND

The NAND type flash memory cells may have a problem in that with the progress of fine patterning, their coupling ratio would lower and so operation voltage is increased. To solve this problem, such a NAND type flash memory cell is proposed as to have a floating gate that includes a plurality of first conductive films and a plurality of second conductive films stacked alternately on each other and has an irregular-shaped side wall and a control gate electrode that is disposed on the top surface and the irregular-shaped side wall of this floating gate (see, for example, Japanese Patent Application Laid-Open No. 2004-207695). Such a structure increases an area in which the floating gate and the control gate electrode overlap and so increases an electrostatic capacitance between them, thereby enabling increasing of the coupling ratio.

With the progress of fine patterning, the size of the cell becomes about twice the thickness of an insulating film between the control gate electrode and the floating gate, so that it is difficult to form the control gate electrode on the side wall of the floating gate.

SUMMARY

According to one aspect of the present invention, there is provided a semiconductor storage device comprising:
a semiconductor substrate;
a plurality of first insulating films formed on the semiconductor substrate with predetermined spacing therebetween;
an element isolation region formed between the first insulating films in a first direction;
a floating gate electrode comprising a first charge accumulation film formed on the first insulating film, a second charge accumulation film formed on the first charge accumulation film and having a width in a second direction orthogonal to the first direction smaller than the width of the first charge accumulation film, and a third charge accumulation film formed on the second charge accumulation film and having the width in the second direction larger than the width of the second charge accumulation film;
a second insulating film formed on the second charge accumulation film and between the second charge accumulation film and the element isolation region;
a third insulating film formed on the charge accumulation film and the element isolation region along the second direction; and
a control gate electrode formed on the third insulating film.

According to one aspect of the present invention, there is provided a semiconductor storage device comprising:
a semiconductor substrate;
a plurality of first insulating films formed on the semiconductor substrate with predetermined spacing therebetween;
an element isolation region formed between the first insulating films in a first direction;
a floating gate electrode comprising a first charge accumulation film formed on the first insulating film, a second charge accumulation film having a width in a second direction orthogonal to the first direction smaller than the width of the first charge accumulation film and formed on the first charge accumulation film so that a cavity may be formed between this second charge accumulation film and the element isolation region, and a third charge accumulation film formed on the second charge accumulation film and having the width in the second direction larger than the width of the second charge accumulation film;
a second insulating film formed on the floating gate electrode and the element isolation region along the second direction; and
a control gate electrode formed on the second insulating film.

DESCRIPTION OF THE EMBODIMENTS

Hereafter, a description will be given of embodiments of the present invention with reference to the drawings.

First Embodiment

FIG. 1(a) shows the top surface of a semiconductor storage device according to the first embodiment of the present invention. The semiconductor storage device has a plurality of bit lines BL formed in a first direction with predetermined spacing therebetween and a plurality of word lines WL formed in a second direction orthogonal to the first direction with predetermined spacing therebetween. One memory cell is formed corresponding to each of intersections between the word lines WL and the bit lines BL, each of which intersections constitutes a gate electrode of the memory cell.

A cross-sectional view of the semiconductor storage device in the word line WL direction (taken along line A-A shown in FIG. 1(a)) is partially shown in FIG. 1(b). In a semiconductor substrate (semiconductor layer) 101, a plurality of buried element isolation regions 102 are formed with predetermined spacing therebetween. The element isolation regions 102 are made of, for example, a silicon dioxide film. Between the element isolation regions 102, a tunnel insulating film 103 is formed on the semiconductor substrate 101.

The tunnel insulating film 103 is made of, for example, a silicon dioxide film. On the tunnel insulating film 103, a floating gate electrode 104 is formed whose top surface has the same height as the element isolation regions 102.

The floating gate electrode 104 has a first charge accumulation film 104a, a second charge accumulation film 104b, and a third charge accumulation film 104c stacked sequentially. A word line-directional width L1 of each of the first charge accumulation film 104a and the third charge accumulation film 104c is larger than a word line-directional width L2 of the second charge accumulation film 104b. Further, between the second charge accumulation film 104b and the element isolation region 102, an insulating film 107 is formed.

The first charge accumulation film 104a and the third charge accumulation film 104c are made of, for example polysilicon and the second charge accumulation film 104b is made of, for example, TaN. Further, the insulating film 107 is obtained by oxidizing the material of the second charge accumulation film 104b.

Over the floating gate electrode 104 and on the element isolation region 102, an interpoly insulating film 105 is formed. The interpoly insulating film 105 is a film stack including, for example, a silicon dioxide film and a silicon nitride film.

On the interpoly insulating film 105, a control gate electrode 106 is formed. The control gate electrode 106 is made of, for example, polysilicon. Further, the upper portion of the polysilicon may be silicided using Co, Ni, Ti, Al, or Pt.

Figure 1:
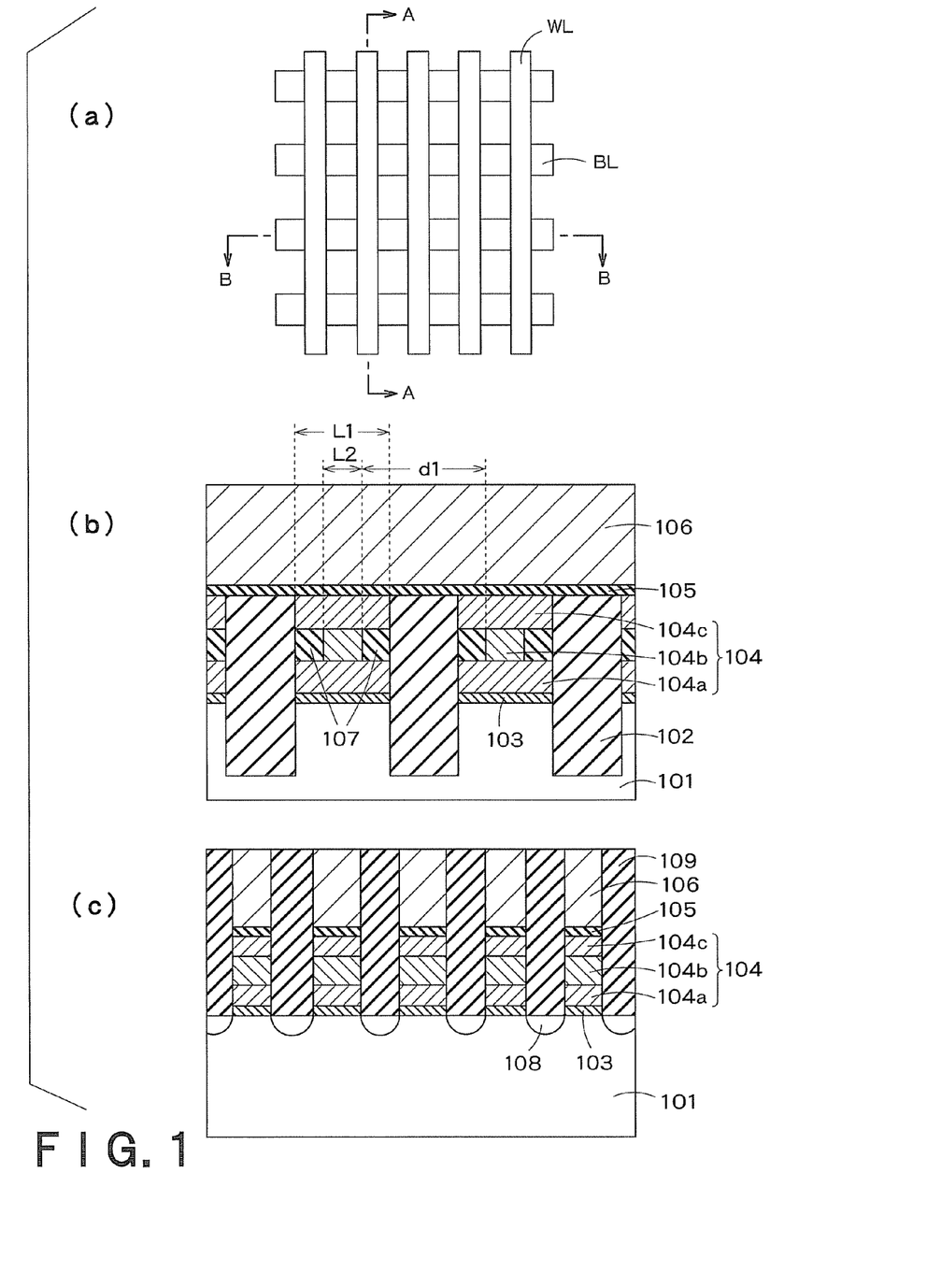
FIGS. 1(a)-1(c) are outlines of a semiconductor storage device according to a first embodiment.

A bit line-directional cross sectional view (taken along line B-B in FIG. 1) of the semiconductor storage device is partially shown in FIG. 1(c). As can be seen from FIG. 1(c), its sectional structure taken along the bit line direction is the same as that publicly known. In the surface of the semiconductor substrate 101, impurity-diffused layers 108 are formed with predetermined spacing therebetween. Between the impurity diffused layers 108, the tunnel insulating film 103, the floating gate electrode 104, the interpoly insulating film 105, and the control gate electrode 106 are stacked sequentially on the semiconductor substrate 101.

On the diffused layers 108, an insulating film 109 is formed in such a manner as to fill a gap between the memory cells. The insulating film 109 is made of, for example, a silicon dioxide film.

In such a manner, in the semiconductor storage device according to the present embodiment, as viewed in the direction of the word line WL, the width L2 of the height-directional intermediate portion (second charge accumulation film 104b) of the floating gate electrode 104 is smaller than the width L1 of each of the lower portion (first charge accumulation film 104a) and the upper portion (third charge accumulation film 104c) as well as the tunnel insulating film 103 of the floating gate electrode 104. Accordingly, it is possible to elongate a distance d1 between the respective floating gate electrodes 104 of the cells which are mutual neighbors in the direction of the word lines WL, thereby reducing the capacitance between the floating gate electrodes 104.

A coupling ratio $C_r$ of each of the memory cells is given by the following equation:

$$C_r = \frac{C_{ipd}}{C_{ipd} + C_{OX} + C_{neighbor}} \quad \text{[Equation 1]}$$

where $C_{ipd}$ indicates a capacitance between the floating gate electrode 104 and the control gate electrode 106, that is, in the interpoly insulating film 105. Further, $C_{ox}$ indicates a capacitance between the floating gate electrode 104 and the semiconductor substrate 101, that is, in the tunnel insulating film 103.

Additionally further, $C_{neighbor}$ indicates a capacitance between the nearest neighboring cells. The capacitance between the nearest neighboring cells contains a capacitance between the respective floating gate electrodes 104 of the nearest neighboring cells.

As described above, the semiconductor storage device according to the present embodiment can reduce the capacitance $C_{neighbor}$ between the cells which are mutual neighbors in the direction of the word lines WL and, therefore, can increase the coupling ratio $C_r$. By increasing the coupling ratio $C_r$, the operation voltage can be decreased, thereby improving performance of the device. Further, an influence by the neighboring cell can be suppressed.

Figure 2:
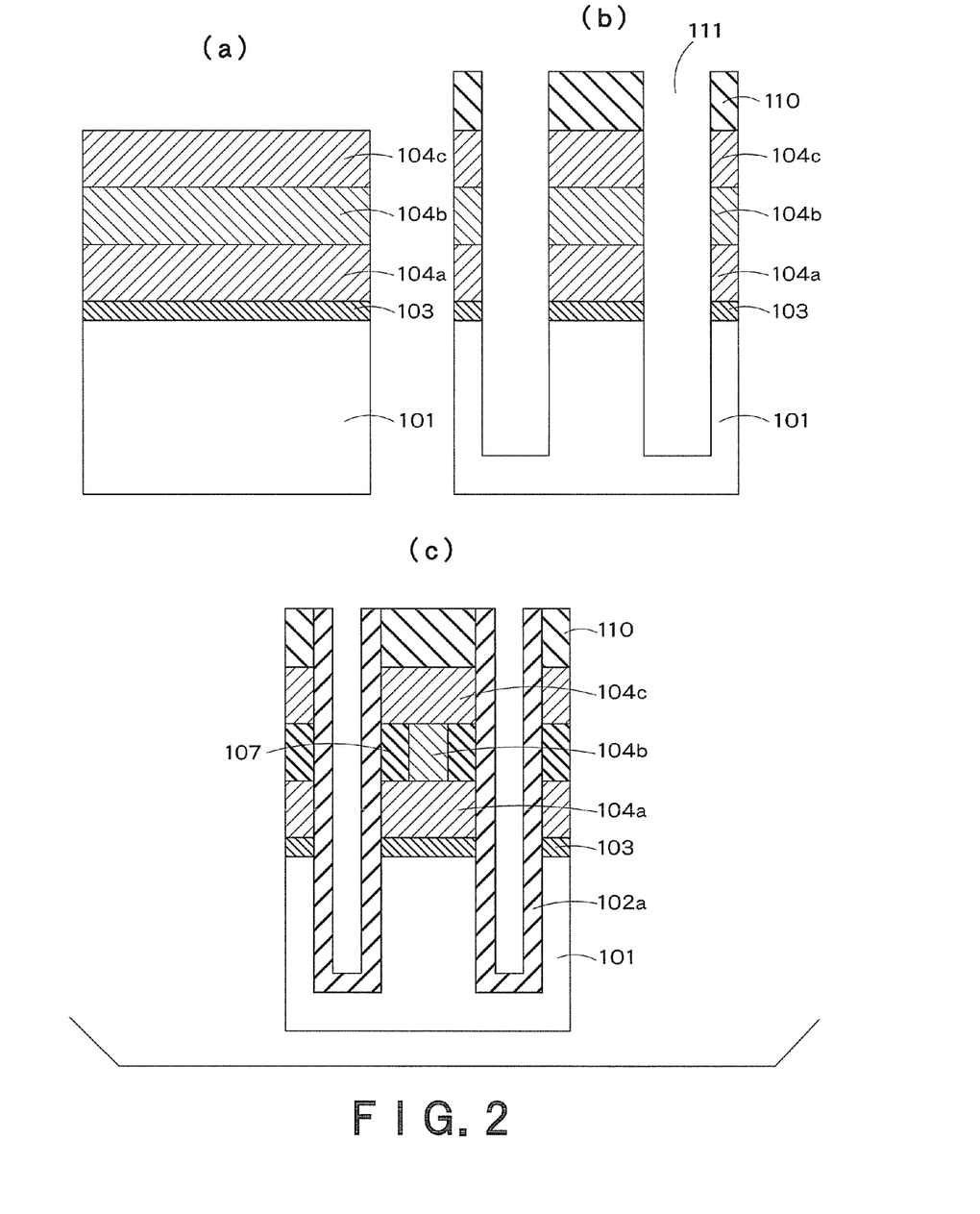
FIGS. 2(a)-2(c) are explanatory process diagrams of a method for manufacturing the semiconductor storage device according to the first embodiment.

Next, a description will be given of a method for manufacturing the semiconductor storage device according to the present embodiment with reference to cross-sectional process diagrams shown in FIG. 2. The cross-sectional process diagrams show a vertical cross section along the second direction (in the direction of the word lines WL).

First, as shown in FIG. 2(a), on the semiconductor substrate 101, the tunnel insulating film 103 made of, for example, a silicon dioxide film is formed by thermal oxidization to a thickness of 5-10 nm. On it, the first charge accumulation film 104a made of, for example, polysilicon and having a thickness of 20 nm, the second charge accumulation film 104b made of, for example, TaN and having a thickness of 30 nm, and the third charge accumulation film 104c made of, for example, polysilicon and having a thickness of 20 nm are deposited sequentially by using chemical vapor deposition (CVD).

Subsequently, as shown in FIG. 2(b), on the third charge accumulation film 104c, the masks 110 configured to form an element isolation region are formed in the first direction with predetermined spacing therebetween. Then, based on the masks 110, the third charge accumulation film 104c, the second charge accumulation film 104b, the first charge accumulation film 104a, the tunnel insulating film 103, and the semiconductor substrate 101 are etched by using anisotropic etching such as reactive ion etching (RIE), thereby forming a plurality of trenches 111.

Subsequently, as shown in FIG. 2(c), a silicon dioxide film 102a is formed in such a manner as to cover the side and bottom surfaces of the trenches 111. Then, via the silicon dioxide film 102a, post-oxidation treatment is performed under such conditions that an oxidation agent ($O_2$) may reach the charge accumulation films 104a-104c.

The material of TaN, of which the second charge accumulation film 104b is made, has a higher rate of oxidation than polysilicon, of which the first and third charge accumulation films 104a and 104c are made. Therefore, both ends of the second charge accumulation film 104b become the insulating film 107.

In such a manner, a structure such as the one shown in FIG. 1(b) can be formed in which the width of the height-directional intermediate portion (second charge accumulation film 104b) of the floating gate electrode 104 is smaller than that of each of the lower portion (first charge accumulation film 104a) and the upper portion (third charge accumulation film 104c) of the floating gate electrode 104.

The subsequent processes are the same as those for the publicly known semiconductor storage device manufacturing method, and illustration thereof will not be made. To describe them simply, first the silicon dioxide film etc., are buried in the trenches 111 to form the element isolation region 102. Next, the mask 110 is removed by chemical mechanical polishing (CMP) etc., to form the interpoly insulating film 105, on which the control gate electrode 106 made of, for example, polysilicon is further formed.

Next, the control gate electrode 106, the interpoly insulating film 105, and the floating gate electrode 104 (as well as the tunnel insulating film 103) are removed by RIE etc., with predetermined spacing therebetween, thereby forming a plurality of trenches. In such a manner, word lines are formed. Then, an impurity such as phosphorus is ion-implanted and caused to undergo thermal treatment, thereby forming the diffused layer 108. Next, for example, a silicon dioxide film is deposited by CVD in such a manner as to fill the trenches, thereby forming the insulating film 109. Further, the control gate electrode 106 may be silicided.

In a semiconductor storage device formed in such a manner, the width of the height-directional intermediate portion (second charge accumulation film 104b) of the floating gate electrode 104 is smaller than that of each of the higher and lower portions of the same, so that the distance between the nearest neighboring cells can be elongated to reduce the capacitance therebetween. Accordingly, it is possible to effectively increase the coupling ratio in each of the memory cells to decrease the operation voltage, thereby improving the performance of the device.

In the semiconductor storage device according to this first embodiment, the higher the percentage of the film thickness of the second charge accumulation film 104b with respect to that of the floating gate electrode 104 is, and the larger the coupling ratio can be made. This is because the capacitance between the nearest neighboring cells can be further reduced.

Further, although the first embodiment has used TaN as the material of the second charge accumulation film 104b, this material may be, for example, SiGe. In a case where SiGe is used as the material of the second charge accumulation film 104b, if thermal oxidation is performed when forming the silicon dioxide film 102a, SiGe is oxidized faster due to the higher rate of oxidation of SiGe, thereby enabling forming the insulating film 107.

Second Embodiment

Figure 3:
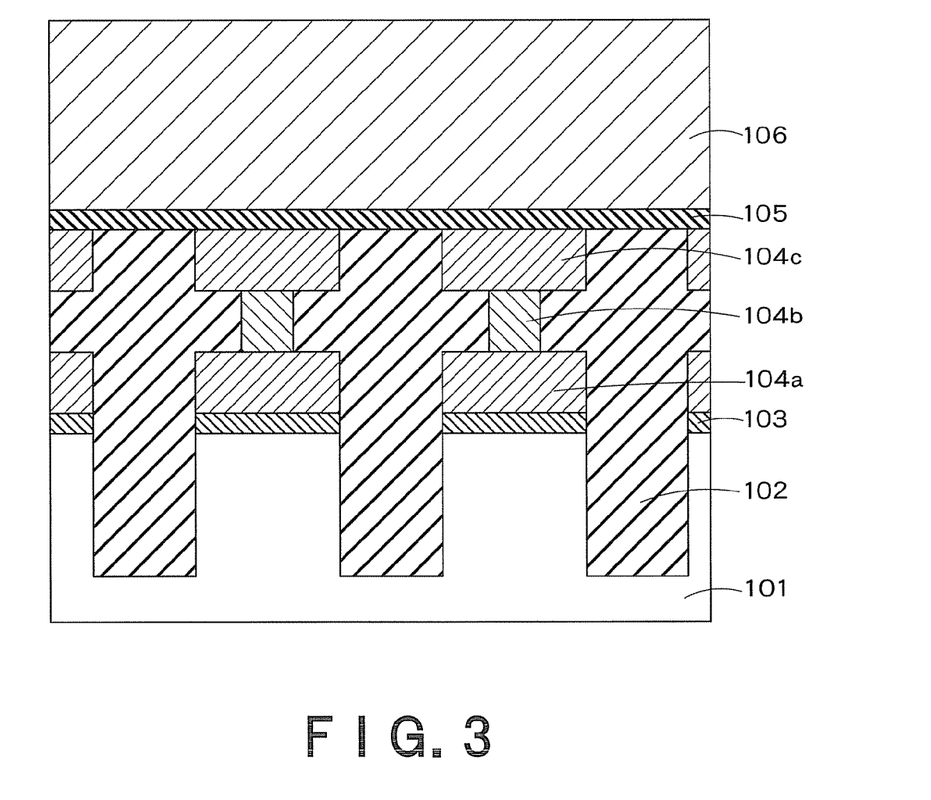
FIG. 3 is an outline of a semiconductor storage device according to a second embodiment.

FIG. 3 shows part of a cross-sectional view (taken along line A-A in FIG. 1(a)) in the direction of word lines WL in a semiconductor storage device according to the second embodiment of the present invention. To the same components as those in the first embodiment shown in FIG. 1(b), identical reference numerals are given, and description on the identical components will not be repeated here.

Although in the first embodiment, the insulating film 107 positioned between the second charge accumulation film 104b and the element isolation region 102 has been made of the material obtained by oxidizing the material of the second charge accumulation film 104b, in the present embodiment, the element isolation film 107 is made of the same material as that of the element isolation region 102.

Even in such a structure, similarly to the first embodiment, the height-directional width of the intermediate portion (second charge accumulation film 104b) is smaller than that of each of the upper and lower portions of the floating gate electrode 104, so that the distance between the nearest neighboring cells can be elongated to reduce the capacitance therebetween.

Figure 4:
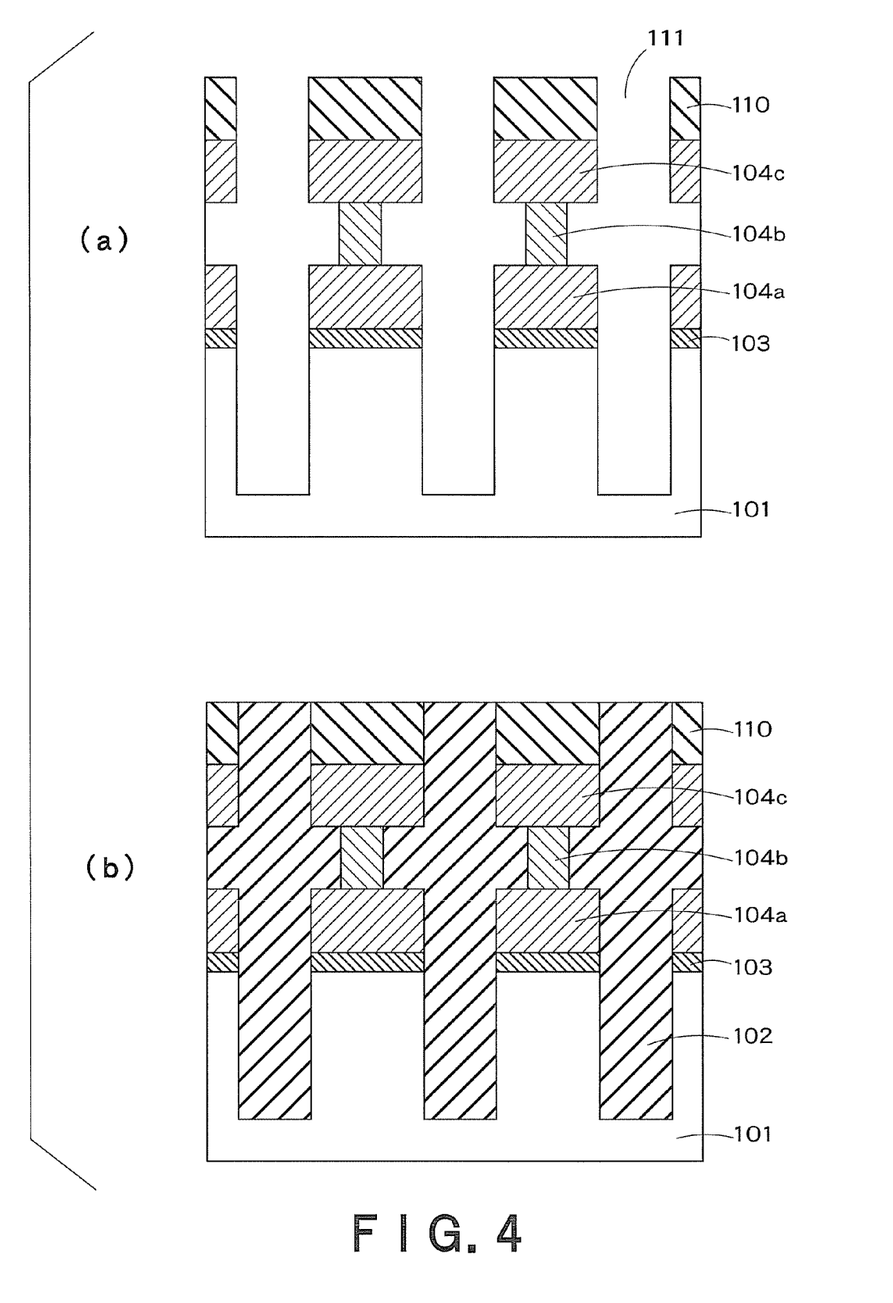
FIGS. 4(a)-4(b) are explanatory process diagrams of a method for manufacturing the semiconductor storage device according to the second embodiment.

A description will be given of a method for manufacturing the semiconductor storage device according to the present embodiment with reference to cross-sectional process diagrams shown in FIG. 4. It is to be noted that the processes up to the formation of the trenches 111 are the same as those in the first embodiment (FIGS. 2(a) and 2(b)), and description thereof will not be repeated here. However, as the material of the second charge accumulation film 104b, SiGe will be used.

As shown in FIG. 4(a), wet etching is performed to remove both ends of the second charge accumulation film 104b. Since SiGe has a higher rate of wet etching than polysilicon, the width of the second charge accumulation film 104b becomes smaller than that of each of a first charge accumulation film 104a and a third charge accumulation film 104c.

Subsequently, as shown in FIG. 4(b), a silicon dioxide film is deposited in such a manner as to fill the trenches 111, thereby forming the element isolation regions 102. Accordingly, the side portion of the second charge accumulation film 104b (region between the first charge accumulation film 104a and the third charge accumulation film 104c) is buried.

The subsequent processes are the same as those in the first embodiment, and descriptions thereof will not be repeated here.

Even by such a manufacturing method, the height-directional width of the intermediate portion (second charge accumulation film 104b) is made smaller than that of each of the upper and lower portions of the floating gate electrode 104, so that the distance between the nearest neighboring cells can be elongated to manufacture such a semiconductor storage device that the capacitance between the nearest neighboring cells may be reduced.

Third Embodiment

A description will be given of a semiconductor storage device according to the third embodiment of the present invention. In contrast to the above-described structures of the first and second embodiments in which the word line WL-directional width of the second charge accumulation film 104b has been smaller than that of each of the first and third charge accumulation films 104a and 104c, in the present embodiment, the bit line BL-directional width of the second charge accumulation film 104b is also smaller than that of each of the first charge accumulation film 104a and the third charge accumulation film 104c.

FIG. 5(a) shows part of a cross-sectional view (taken along line B-B in FIG. 1(a)) in the direction of bit lines BL. In the surface of a semiconductor substrate 101, impurity diffused layers 108 are formed with predetermined spacing therebetween. On the semiconductor substrate 101 between the impurity diffused layers 108, a tunnel insulating film 103, a floating gate electrode 104, an interpoly insulating film 105, and a control gate electrode 106 are stacked sequentially. On the diffused layers 108, an insulating film 109 is formed in such a manner as to fill the gap between memory cells. The insulating film 109 is made of, for example, a silicon dioxide film.

The floating gate electrode 104 has a first charge accumulation film 104a, a second charge accumulation film 104b, and a third charge accumulation film 104c which are stacked sequentially. A bit line-directional width L3 of each of the first charge accumulation film 104a and the third charge accumulation film 104c is set larger than a bit line-directional width L4 of the second charge accumulation film 104b. Further, between the second charge accumulation film 104b and the insulating film 109, an insulating film 120 is formed.

The first charge accumulation film 104a and the third charge accumulation film 104c are made of, for example, polysilicon and the second charge accumulation film 104b is made of, for example, TaN. Further, the insulating film 120 is made of a material obtained by oxidizing the material of the second charge accumulation film 104b.

In such a manner, in the semiconductor storage device according to the present embodiment, as viewed in the direction of the bit line BL, the width L4 of the height-directional intermediate portion (second charge accumulation film 104b) of the floating gate electrode 104 is smaller than the width L3 of each of the lower portion (first charge accumulation film 104a) and the upper portion (third charge accumulation film 104c). Accordingly, it is possible to elongate a distance d2 between the respective floating gate electrodes 104 of the cells which are mutual neighbors in the direction of the bit lines BL, thereby reducing the capacitance between the floating gate electrodes 104.

Furthermore, it is possible to elongate a distance d3 between the floating gate electrode 104 and the control gate electrode 106 of the neighboring cell, thereby reducing the capacitance therebetween.

Those capacitances are contained in $C_{neighbor}$ in the equation 1 given above. Therefore, the semiconductor storage device according to the present embodiment is capable of reducing the capacitance $C_{neighbor}$ between the cells which are mutual neighbors in the bit line direction, thereby increasing the coupling ratio $C_r$ further. This enables further reducing the operation voltage, thereby further improving the performance of the device.

It is to be noted that FIGS. 5(b) and 5(c) show examples of horizontal cross sections taken along line C-C in FIG. 5(a). The shape of the second charge accumulation film 104b depends on the manufacturing method employed.

Figure 6:
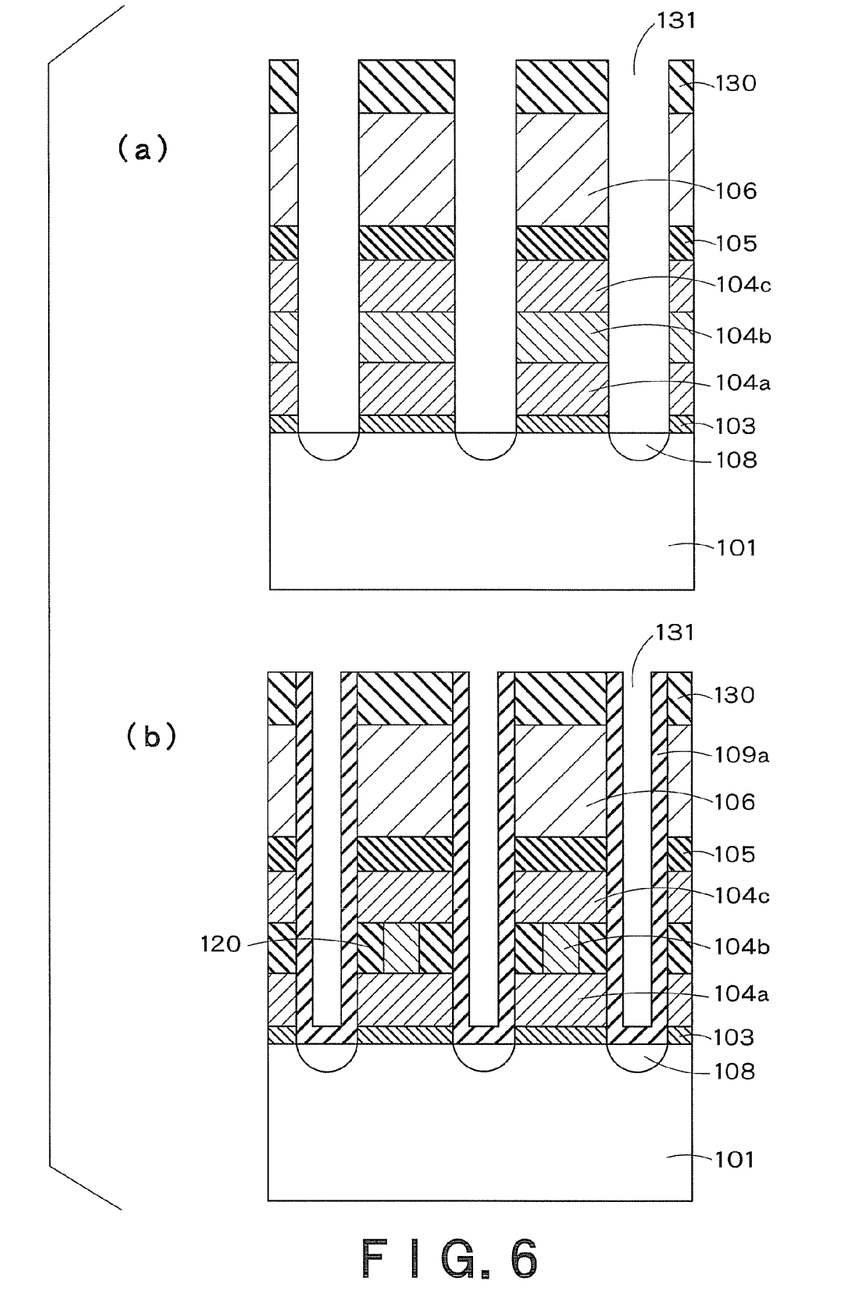
FIGS. 6(a)-6(b) are explanatory process diagrams of a method for manufacturing the semiconductor storage device according to the third embodiment.

Next, a description will be given of the method for manufacturing the semiconductor storage device according to the present embodiment with reference to cross-sectional process diagrams shown in FIG. 6. The processes up to the formation of an interpoly insulating film 105 and a control gate electrode 106 are the same as those in the first embodiment, and therefore, description thereof will not be repeated here. The cross-sectional process diagrams show a vertical cross section in the first direction (direction of the bit lines BL).

As shown in FIG. 6(a), on the control gate electrode 106, masks 130 configured to form word lines are formed in the second direction with predetermined spacing therebetween. Then, based on the masks 130, the control gate electrode 106, the interpoly insulating film 105, and a floating gate electrode 104 (as well as a tunnel insulating film 103) are etched by RIE etc., thereby forming a plurality of trenches 131. In such a manner, the word lines are formed. Then, an impurity such as phosphorus is ion-implanted into the semiconductor substrate 101 and caused to undergo thermal treatment, thereby forming diffused layers 108.

Next, as shown in FIG. 6(b), a silicon dioxide film 109a is formed in such a manner as to cover the side and bottom surfaces of the trenches 131. Then, via the silicon dioxide film 109a, post-oxidation treatment is performed under such conditions that an oxidation agent ($O_2$) may reach the charge accumulation films 104a-104c.

The material of TaN, of which the second charge accumulation film 104b is made, has a higher rate of oxidation than polysilicon, of which the first and third charge accumulation films 104a and 104c are made. Therefore, both ends of the second charge accumulation film 104b become an insulating film 120.

In such a manner, a structure such as the one shown in FIG. 5(a) can be formed in which a width L4 of the height-directional intermediate portion (second charge accumulation film 104b) of the floating gate electrode 104 is smaller than a width L3 of each of the lower portion (first charge accumulation film 104a) and the upper portion (third charge accumulation film 104c) of the floating gate electrode 104.

The subsequent processes are the same as those for the publicly known manufacturing method, and illustration will not be made thereon. For example, a silicon dioxide film is deposited by CVD in such a manner as to fill the trenches 131, thereby forming an insulating film 109.

In the semiconductor storage device formed in such a manner, in a bit line BL-directional cross-sectional view, the width L4 of the height-directional intermediate portion (second charge accumulation film 104b) of the floating gate electrode 104 is smaller than the width L3 of each of the upper and lower portions of the same, so that the distance between the nearest neighboring cells can be elongated to reduce the capacitance therebetween. Accordingly, it is possible to effectively increase the coupling ratio in each of the memory cells to decrease the operation voltage, thereby improving the performance of the device.

This third embodiment, in which the width of the second charge accumulation film 104b has been set smaller than that of each of the first charge accumulation film 104a and the third charge accumulation film 104c in both of the word line WL direction and the bit line BL direction, may be modified so that this width would be smaller than that only in the bit line BL direction by avoiding performing the oxidation treatment shown in FIG. 2(c).

Fourth Embodiment

The third embodiment may be modified so that the second charge accumulation film 104b would be made of, for example, SiGe and, after the formation of the trenches 131, wet etching may be performed to remove both ends thereof. Since SiGe has a higher rate of wet etching than polysilicon, the width of the second charge accumulation film 104b becomes smaller than that of each of the first charge accumulation film 104a and the third charge accumulation film 104c.

Then, a silicon dioxide film is formed in such a manner as to fill the trenches 131, thereby forming an insulating film 109. In doing this, the side portion of the second charge accumulation film 104b (region between the first charge accumulation film 104a and the third charge accumulation film 104c) is buried.

Figure 5:
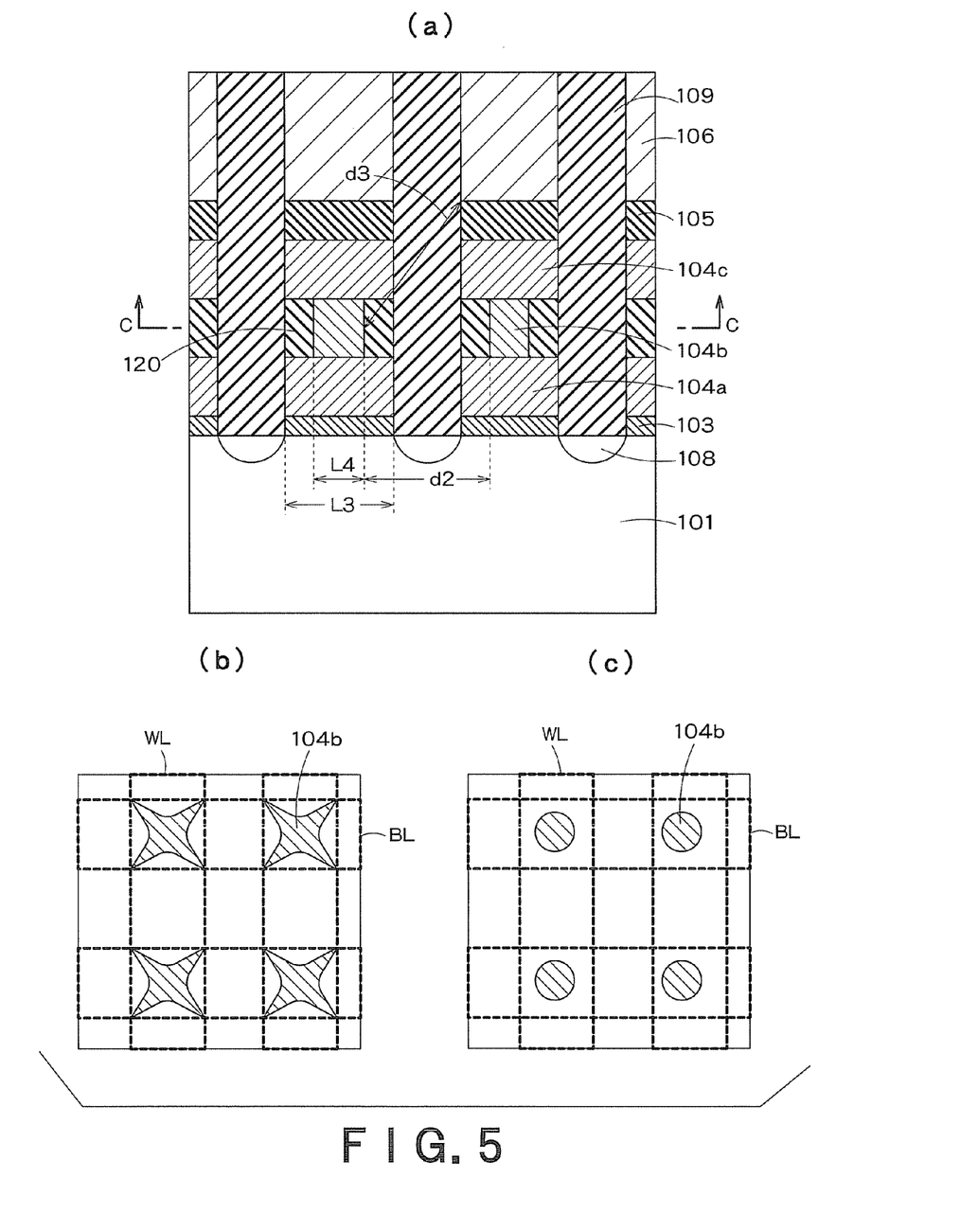
FIGS. 5(a)-5(c) are outlines of a semiconductor storage device according to a third embodiment.

In such a manner, a semiconductor storage device will be manufactured which has such a structure as shown in FIG. 5, in which the insulating film 109 may be formed also on the portions of the insulating film 120. Even in such a structure of the semiconductor storage device, similarly to the third embodiment, in a bit line BL-directional cross-sectional view, a width L4 of the height-directional intermediate portion (second charge accumulation film 104b) of the floating gate electrode 104 is smaller than a width L3 of each of the upper and lower portions of the same, so that the distance between the nearest neighboring cells can be elongated to reduce the capacitance therebetween.

Fifth Embodiment

Figure 7:
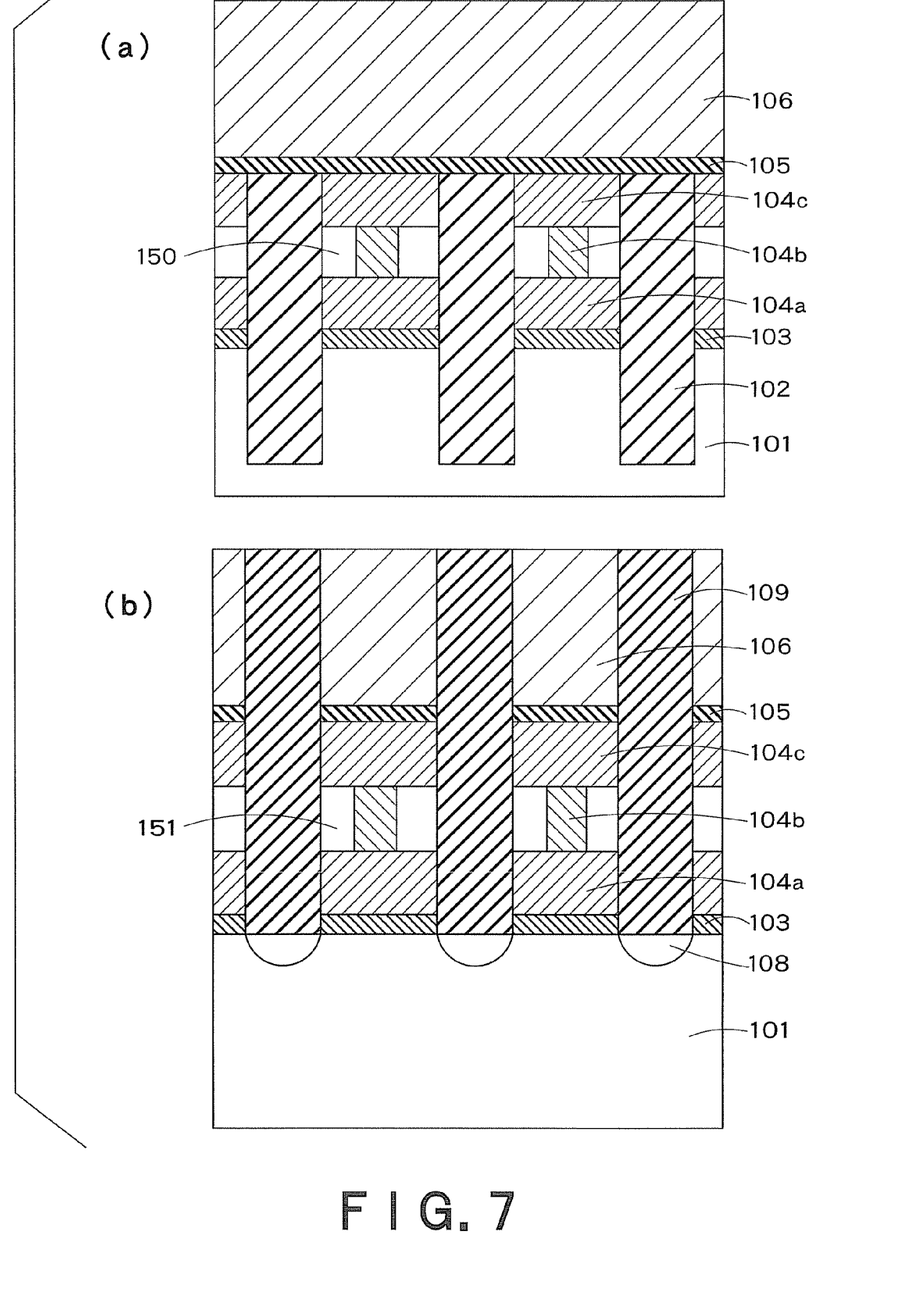
FIGS. 7(a)-7(b) are outlines of a semiconductor storage device according a fifth embodiment.

Unlike the first and second embodiments in which the insulating films (107, 104) have been formed on both of the word line WL-directional side portions of the second charge accumulation film 104b, in the present embodiment, a cavity 150 is formed as shown in FIG. 7(a). The cavity 150 has a higher dielectric constant than the insulating films and so gives almost the same effects as an increase in distance between the nearest neighboring cells, thereby enabling further reduction of the capacitance between those cells. It is, therefore, possible to further increase the coupling ratio in each of the memory cells, which leads to further improvement of the performance of a device.

When manufacturing such a semiconductor storage device, as shown in FIG. 4(a), wet etching is performed to remove both ends of the second charge accumulation film 104b, and subsequently, a silicon dioxide film is deposited using application etc., to form an element isolation region 102. Since the semi-liquid silicon dioxide film, which has a high viscosity and so is poor (not good) in ease of being buried, is deposited using application, this silicon dioxide film will not enter a region where the second charge accumulation film 104b is removed, so that the cavity 150 can be formed. Then, the semi-liquid silicon dioxide film is heat-hardened by annealing.

In such a manner, such a structure can be formed that the cavity 150 may be formed between the second charge accumulation film 104b and the element isolation region 102.

A similar method may be applied after the bit line BL-directional ends of the second charge accumulation film 104b are both removed in the fourth embodiment. In this case, as shown in FIG. 7(b), it is possible to form a structure in which a cavity 151 is formed between the second charge accumulation film 104b and the insulating film 109.

Also in a structure shown in FIG. 7(b), the cavity 151 can give almost the same effects as an increase in distance between the nearest neighboring cells, thereby further reducing the capacitance between those cells. It is, therefore, possible to further increase the coupling ratio in each of the memory cells, thereby further improving the performance of the device.

Sixth Embodiment

Figure 8:
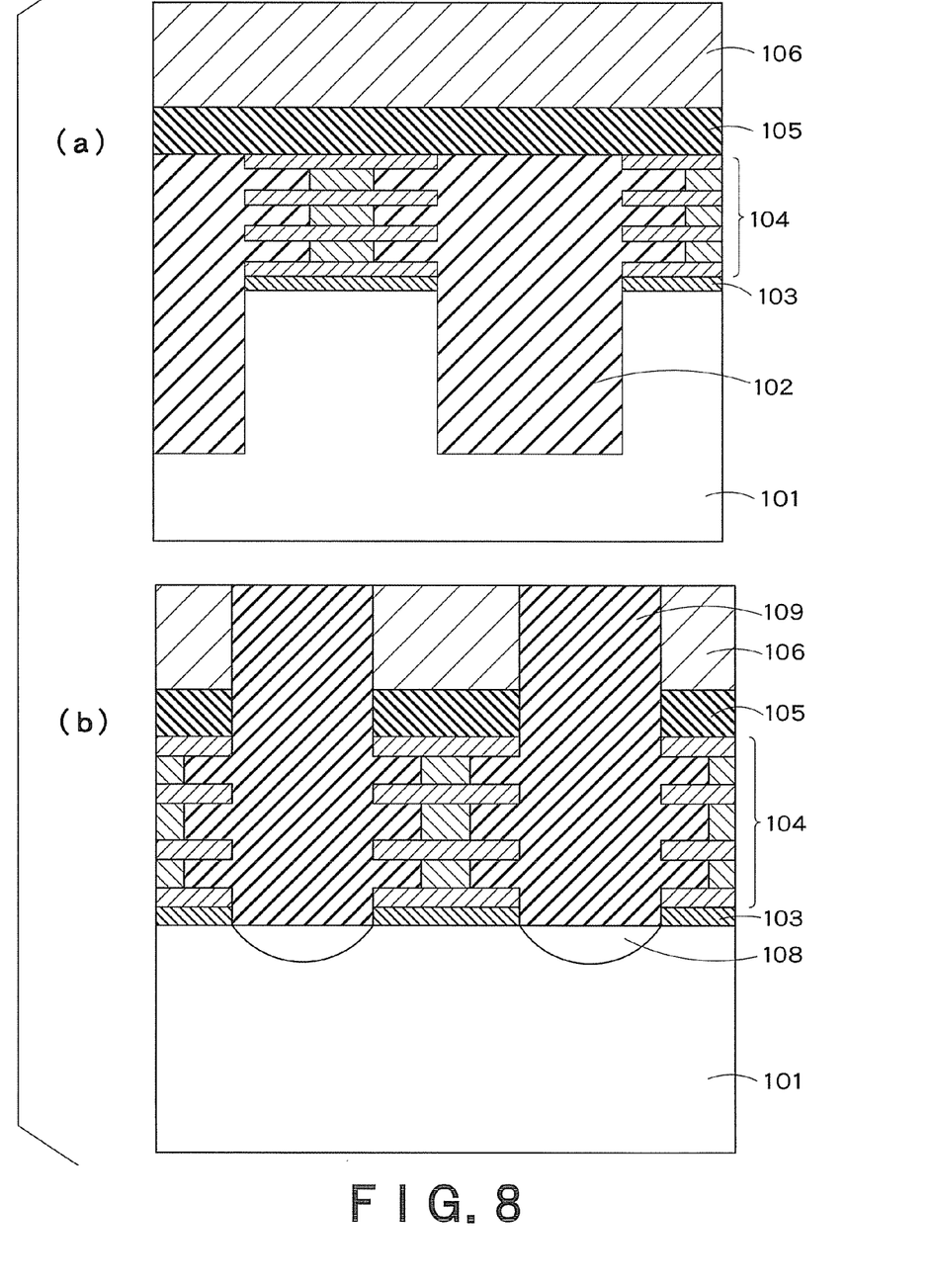
FIGS. 8(a)-8(b) are outlines of a semiconductor storage device according a sixth embodiment.

Although in the first through fifth embodiments, the floating gate electrode 104 has had the first through third charge accumulation films 104a-104c and its height-directional intermediate portion, that is, the second charge accumulation film 104b has had a smaller width than the others, the wider charge accumulation film and the narrower charge accumulation film may be alternately formed a plurality of number of times. One example of such a structure is shown in FIG. 8. FIG. 8(a) shows its cross-sectional view taken along the direction of a word line WL and FIG. 8(b) shows its cross-sectional view taken along the direction of a bit line BL.

The floating gate electrode 104 is a stack of an odd number of the charge accumulation films, in which the odd-numbered charge accumulation films, as counted from the bottom, have the larger width and the even-numbered ones have the smaller width. The 2k'th, as counted from the bottom, (k is an integer of 1 or larger) charge accumulation film's side portion (region sandwiched between the (2k−1)'th charge accumulation film and the (2k+1)'th charge accumulation film) has insulating films (102, 109) formed thereon.

Even in such a structure, similarly to the aforementioned embodiments, the small with of the charge accumulation films enables elongating the distance between the nearest neighboring cells, thereby manufacturing a semiconductor storage device having a reduced capacitance between the nearest neighboring cells.

Seventh Embodiment

Figure 9:
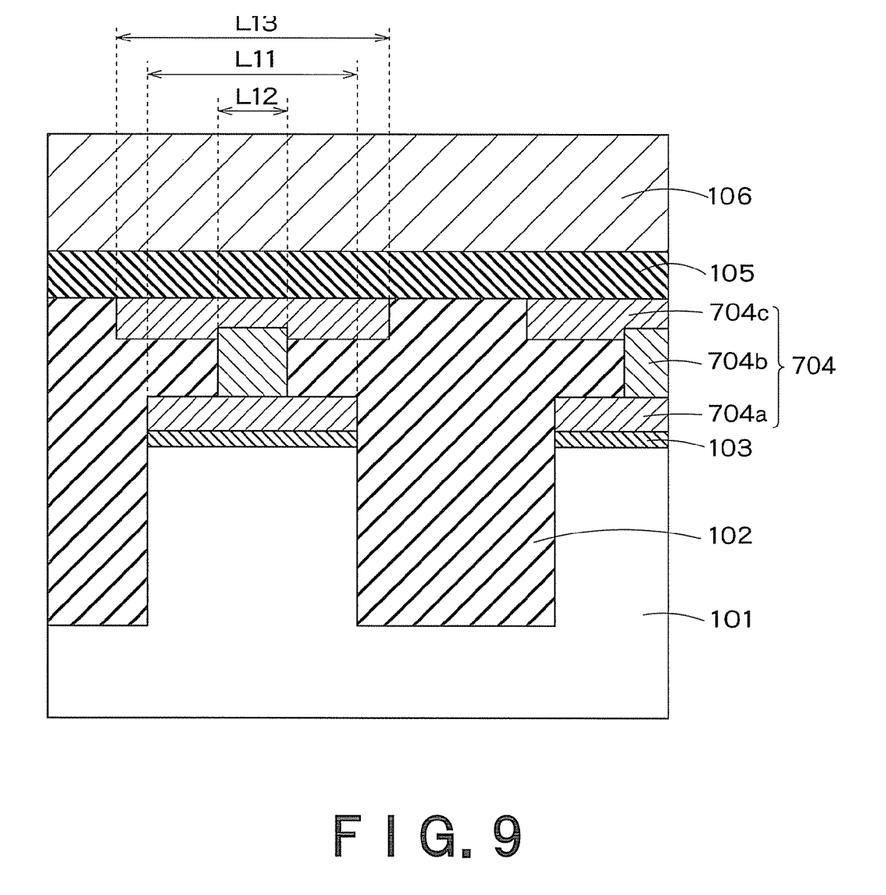
FIG. 9 is an outline of a semiconductor storage device according to a seventh embodiment.

FIG. 9 shows the outlined structure of a semiconductor storage device according to the seventh embodiment of the present invention. FIG. 9 shows a word line WL-directional cross section (taken along line A-A in FIG. 1(a)). To the same components as those in the second embodiment shown in FIG. 3, identical reference numerals are given, and descriptions on the identical components will not be repeated.

A floating gate electrode 704 has a first charge accumulation film 704a, a second charge accumulation film 704b, and a third charge accumulation film 704c stacked sequentially. The first charge accumulation film 704a and the third charge accumulation film 704c are made of, for example, polysilicon and the second charge accumulation film 704b is made of TaN, SiGe, etc.

Assuming the width of the first charge accumulation film 704a to be L11, that of the second charge accumulation film 704b to be L12, and that of the third charge accumulation film 704c to be L13, a relationship of L12<L11<L13 is established.

Similarly to the first and second embodiments, by making the width L12 of a height-directional intermediate portion (second charge accumulation film 704b) smaller than each of the width L11 of a lower portion (first charge accumulation film 704a) and the width L13 of an upper portion (third charge accumulation film 704c) of the floating gate electrode 704, it is possible to elongate the distance between the respective floating gate electrodes 704 of cells which are mutual neighbors in the direction of the word lines WL, thereby reducing the capacitance between the floating gate electrodes 704. Therefore, the coupling ratio can be increased, thereby improving the performance of the device.

Further, in the present embodiment, the width L13 of the upper portion (third charge accumulation film 704c) is set larger than the width L12 of the lower portion (first charge accumulation film 704a) of the floating gate electrode 704. This increases an area in which this electrode faces a control gate electrode, thereby enabling further increasing the coupling ratio.

Figure 10:
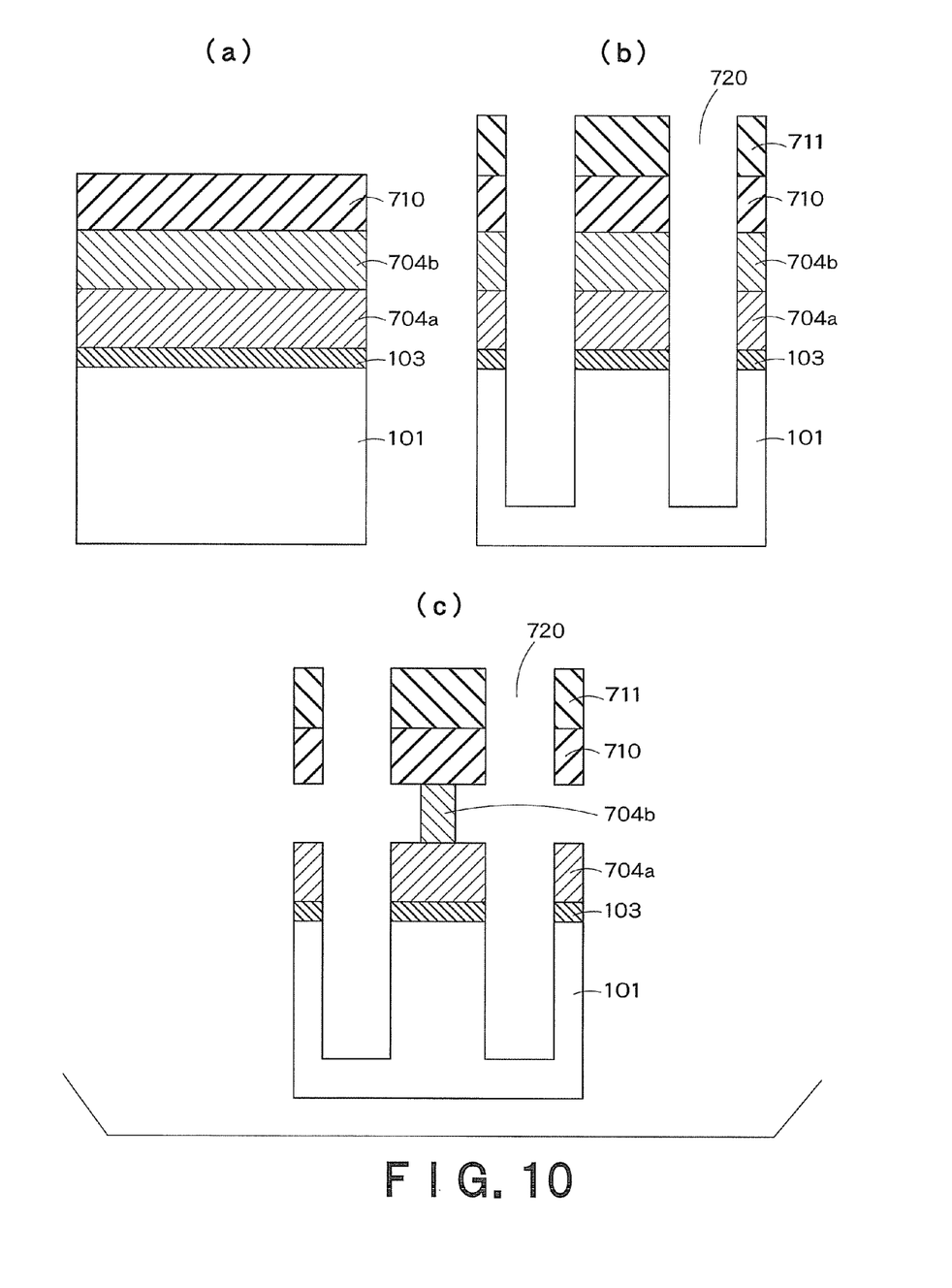
FIGS. 10(a)-10(c) and 11(a)-11(d) are explanatory process diagrams of a method for manufacturing the semiconductor storage device according to the seventh embodiment.
Figure 11:
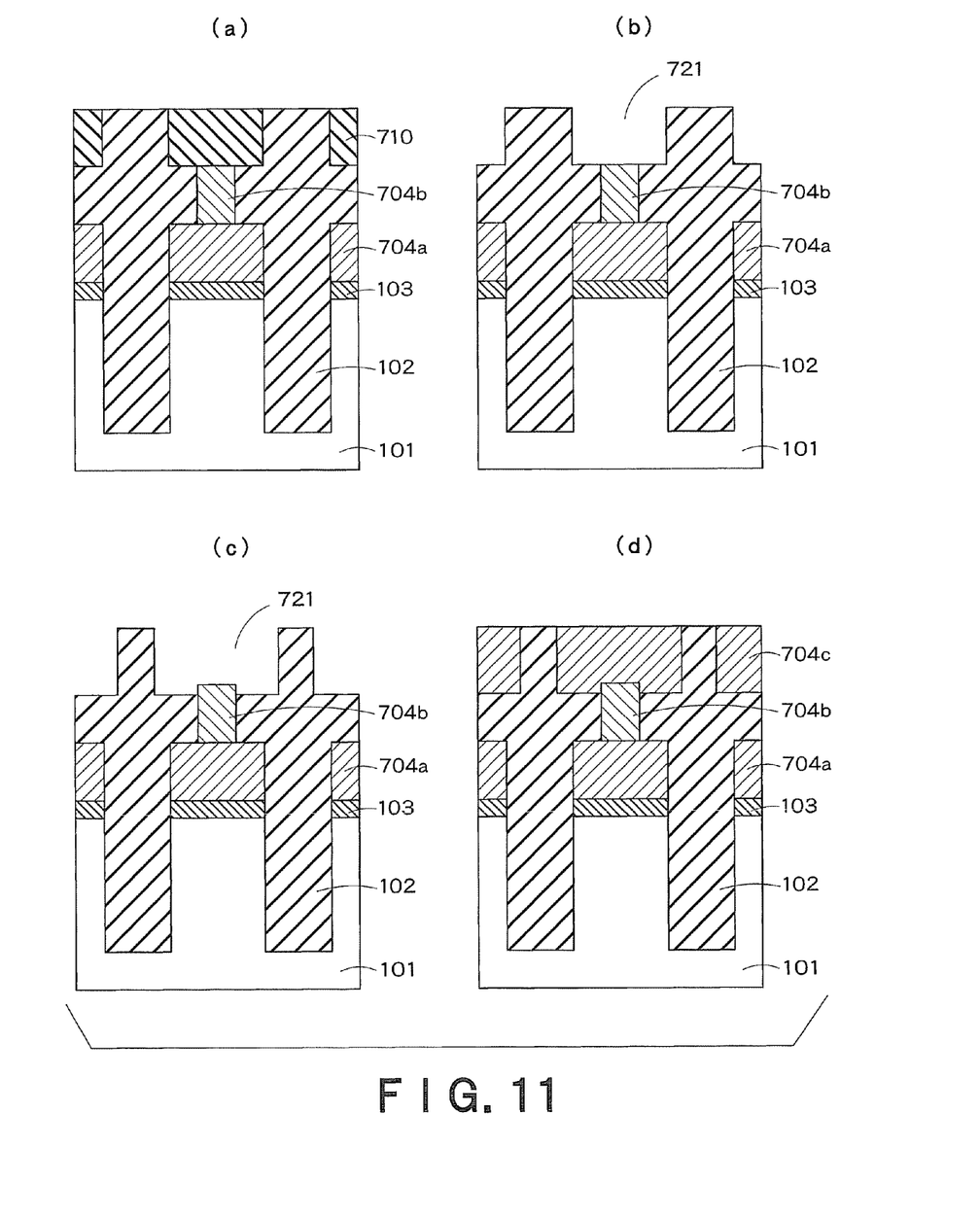

A description will be made of a method for manufacturing such a semiconductor storage device with reference to cross-sectional process diagrams shown in FIGS. 10 and 11. The cross-sectional process diagrams show a vertical cross section in the word line WL direction (taken along line A-A in FIG. 1(a)).

First, as shown in FIG. 10(a), on a semiconductor substrate 101, a tunnel insulating film 103 made of, for example, a silicon dioxide film is formed by thermal oxidation to a thickness of 5-10 nm. On it, the first charge accumulation film 704a made of, for example, polysilicon and having a thickness of 20 nm, the second charge accumulation film 704b made of, for example, TaN and having a thickness of 30 nm, and a sacrificial film 710 made of, for example, a silicon nitride film and having a thickness of 20 nm are deposited sequentially by using CVD.

As shown in FIG. 10(b), on the sacrificial film 710, masks 711 configured to form an element isolation region are formed in the aforementioned first direction with predetermined spacing therebetween. Then, based on the masks 711, the sacrificial film 710, the second charge accumulation film 704b, the first charge accumulation film 704a, the tunnel insulating film 103, and the semiconductor substrate 101 are etched by anisotropic etching such as reactive ion etching (RIE), thereby forming a plurality of trenches 720.

As shown in FIG. 10(c), wet etching is performed to remove both ends of the second charge accumulation film 104b. Since SiGe has a higher rate of wet etching than polysilicon, the width of the second charge accumulation film 704b becomes smaller than that of each of the first charge accumulation film 704a and the sacrificial film 710.

As shown in FIG. 11(a), a silicon dioxide film is deposited in such a manner as to fill the trenches 720 and then the masks 111 are removed by CMP etc., to form an element isolation region 102. Simultaneously, the side portion of the second charge accumulation film 704b is also buried.

As shown in FIG. 11(b), the sacrificial film 710 is removed by using wet etching.

As shown in FIG. 11(c), the width is increased of a region 721 in which the sacrificial film 710 is removed by wet etching.

As shown in FIG. 11(d), polysilicon is buried in the region 721 by CVD etc., to form the third charge accumulation film 704c.

In such a manner, it is possible to form such a structure as shown in FIG. 9, in which the width L12 of the height-directional intermediate portion (second charge accumulation film 704b) is set smaller than each of the width L11 of the lower portion (first charge accumulation film 704a) and the width L13 of the upper portion (third charge accumulation film 704c) of the floating gate electrode 704. Further, the width L11 of the lower portion (first charge accumulation film 704a) of the floating gate electrode 104 is also set smaller than the width L13 of the upper portion (third charge accumulation film 704c) of the same.

The subsequent processes are the same as those in the first embodiment, and illustration thereof will not be repeated here.

In the semiconductor storage device formed in such a manner, in a bit line BL-directional cross-sectional view, the width of the height-directional intermediate portion (second charge accumulation film 704b) of the floating gate electrode 704 is small, so that the distance between the nearest neighboring cells can be elongated to reduce the capacitance therebetween. Accordingly, it is possible to effectively increase the coupling ratio in each of the memory cells to decrease the operation voltage, thereby improving the performance of the device.

In the first through seventh embodiments, an SOI substrate may be used as the semiconductor substrate 101.

Further, although in those embodiments, the respective top surfaces of the element isolation region 102 and the floating gate electrode 104 have been set to the same height, such a structure may be employed that the top surface of the element isolation region 102 would be set lower in height than that of the floating gate electrode 104 to put down a control gate electrode 106 between the floating gate electrodes 104. It is possible to increase the electrostatic capacitance between the floating gate electrode 104 and the control gate electrode 106 and, hence, the coupling ratio in each memory cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
a semiconductor substrate;
a plurality of first insulating films formed on the semiconductor substrate with predetermined spacing therebetween;
an element isolation region formed between the first insulating films in a first direction;
a floating gate electrode comprising a first charge accumulation film formed on the first insulating film, a second charge accumulation film formed on the first charge accumulation film and having a width in a second direction orthogonal to the first direction smaller than the width of the first charge accumulation film, and a third charge accumulation film formed on the second charge accumulation film and having the width in the second direction larger than the width of the second charge accumulation film;
a second insulating film formed on the second charge accumulation film and between the second charge accumulation film and the element isolation region;
a third insulating film formed on the floating gate electrode and the element isolation region along the second direction; and
a control gate electrode formed on the third insulating film.

2. The semiconductor storage device according to claim 1, wherein the width of the second charge accumulation film in the first direction is smaller than each of the width of the first charge accumulation film and the width of the third charge accumulation film in the first direction.

3. The semiconductor storage device according to claim 2, wherein the width of the third charge accumulation film in the second direction is larger than the width of the first charge accumulation film in the second direction.

4. The semiconductor storage device according to claim 2, wherein the second insulating film contains the same material as the element isolation region.

5. The semiconductor storage device according to claim 2, wherein the first direction is parallel to word lines and the second direction is parallel to bit lines.

6. The semiconductor storage device according to claim 1, wherein the width of the third charge accumulation film in the second direction is larger than the width of the first charge accumulation film in the second direction.

7. The semiconductor storage device according to claim 6, wherein the second insulating film contains the same material as the element isolation region.

8. The semiconductor storage device according to claim 6, wherein the first direction is parallel to word lines and the second direction is parallel to bit lines.

9. The semiconductor storage device according to claim 1, wherein the second insulating film contains a material obtained by oxidizing the second charge accumulation film.

10. The semiconductor storage device according to claim 1, wherein the second insulating film contains the same material as the element isolation region.

11. The semiconductor storage device according to claim 1, wherein a top surface of the element isolation region is lower than the top surface of the third charge accumulation film.

12. The semiconductor storage device according to claim 1,
wherein the floating gate electrode further comprises fourth through (2n+1)'th charge accumulation films sequentially formed on the third charge accumulation film, where n is an integer not smaller than 2,
the width of the i'th charge accumulation film in the second direction is the same as the width of the second charge accumulation film, where i is an even number satisfying a relationship of $4 \leq i \leq 2n$, and
wherein the width of the j'th charge accumulation film in the second direction is the same as the width of the first charge accumulation film, where j is an odd number satisfying the relationship of $5 \leq j \leq 2n+1$.

13. The semiconductor storage device according to claim 1, wherein the first direction is parallel to word lines and the second direction is parallel to bit lines.

14. A semiconductor storage device comprising:
a semiconductor substrate;

a plurality of first insulating films formed on the semiconductor substrate with predetermined spacing therebetween;

an element isolation region formed between the first insulating films in a first direction;

a floating gate electrode comprising a first charge accumulation film formed on the first insulating film, a second charge accumulation film having a width in a second direction orthogonal to the first direction smaller than the width of the first charge accumulation film and formed on the first charge accumulation film so that a cavity is formed between this second charge accumulation film and the element isolation region, and a third charge accumulation film formed on the second charge accumulation film and having the width in the second direction larger than the width of the second charge accumulation film;

a second insulating film formed on the floating gate electrode and the element isolation region along the second direction; and a control gate electrode formed on the second insulating film.

15. The semiconductor storage device according to claim 14, wherein the width of the second charge accumulation film in the first direction is smaller than each of the width of the first charge accumulation film and the width of the third charge accumulation film in the first direction, and wherein a third insulating film is further comprised which is formed on a side portion of the floating gate electrode in the first direction so that a cavity is formed between this third insulating film and the second charge accumulation film.

16. The semiconductor storage device according to claim 15, wherein the first direction is parallel to word lines and the second direction is parallel to bit lines.

17. The semiconductor storage device according to claim 14, wherein a top surface of the element isolation region is lower than the top surface of the third charge accumulation film.

18. The semiconductor storage device according to claim 14, wherein the first direction is parallel to word lines and the second direction is parallel to bit lines.

* * * * *